(12) United States Patent
Middendorf et al.

(10) Patent No.: US 6,572,710 B2
(45) Date of Patent: Jun. 3, 2003

(54) BRUSH FORCE CONTROL METHOD FOR A SUBSTRATE CLEANING APPARATUS

(75) Inventors: Daniel O. Middendorf, Cleves, OH (US); Thomas R. Slavik, Goshen, OH (US); James G. Johnson, San Jose, CA (US); Dean A. Donovan, Hamilton, OH (US)

(73) Assignee: Rite Track Equipment Services, Inc., Westchester, OH (US)

( * ) Notice: Subject to any disclaimer, the term of this patent is extended or adjusted under 35 U.S.C. 154(b) by 0 days.

(21) Appl. No.: 10/212,489

(22) Filed: Aug. 5, 2002

(65) Prior Publication Data

US 2003/0000550 A1 Jan. 2, 2003

Related U.S. Application Data

(62) Division of application No. 09/519,830, filed on Mar. 6, 2000, now Pat. No. 6,446,296.

(51) Int. Cl.$^7$ .................................................. B08B 7/00
(52) U.S. Cl. ........................... 134/6; 134/138; 15/21.1; 15/77; 15/88.2; 15/88.3; 15/102
(58) Field of Search ........................ 134/6, 18; 15/21.1, 15/77, 88.2, 88.3, 102

(56) References Cited

U.S. PATENT DOCUMENTS

| | | | |
|---|---|---|---|
| 4,382,308 A | 5/1983 | Curcio | |
| 5,144,711 A | 9/1992 | Gill, Jr. | |
| 5,203,360 A | 4/1993 | Nguyen et al. | |
| 5,475,889 A | 12/1995 | Thrasher | |
| 5,581,837 A | 12/1996 | Uchiyama et al. | |
| 5,636,401 A | 6/1997 | Yonemizu | |
| 5,685,039 A | 11/1997 | Hamada et al. | |
| 5,875,507 A | 3/1999 | Stephens et al. | |
| 5,899,216 A | 5/1999 | Goudie et al. | |
| 5,933,902 A | 8/1999 | Frey | |
| 5,950,327 A | 9/1999 | Peterson et al. | |
| 5,975,094 A | 11/1999 | Shurtliff | |
| 6,292,972 B1 | 9/2001 | Ishihara | |

Primary Examiner—Zeinab El-Arini
(74) Attorney, Agent, or Firm—Wood, Herron & Evans, L.L.P.

(57) ABSTRACT

A method of cleaning a substrate supported on an upper end of a spindle by first positioning a brush at a fixed elevation over the substrate. Next, the spindle is moved upward to bring the substrate into contact with the brush. Thereafter, a cleaning force on the substrate caused by the brush is measured, and the spindle is moved in response to the measured cleaning force on the substrate.

18 Claims, 5 Drawing Sheets

BRUSH FORCE CONTROL METHOD FOR A SUBSTRATE CLEANING APPARATUS

This application is a Divisional application of U.S. Ser. No. 09/519,830, now U.S. Pat. No. 6,446,296, entitled "Substrate Cleaning Apparatus With Brush Force Control and Method", filed Mar. 6, 2000.

FIELD OF THE INVENTION

The present invention generally relates to an apparatus for semiconductor processing and more specifically, to an improved substrate cleaning apparatus.

BACKGROUND OF THE INVENTION

As used herein, semiconductor substrate processing includes but is not limited to the processing of carriers, sliders, wafers, disk heads, disks, squares, rounds, reticles and flat panel displays. At one or more stages of processing a semiconductor substrate, as indicated above, it is often necessary to clean the substrate, and various machines for cleaning substrates are known in which the substrates are cleaned by ultrasonic, megasonic or gigasonic energy, low, medium or high pressure water at various temperatures, brushes, either fixed or rotating, or other means. Further, the substrate is supported in either a vertical or horizontal orientation during the cleaning process. The cleaning process may be implemented while the substrate is either at a fixed position or moving with respect to one or more cleaning devices. If at a fixed position, the substrate is either stationary or rotating, and cleaning devices, for example, brushes, are most often rotating although nonrotating brushes may also be used.

Of particular importance in maintaining the integrity of the cleaning process is providing a desired pressure or force between the brush and the substrate during the cleaning process. If there is too little brush pressure or force, an inferior cleaning action is produced; and the quality of the cleaning process is poor. However, with too great a brush force on the substrate, the brush medium, for example, bristles, may bend or deflect to such an extent that the brush action is less effective or can cause substrate damage, thereby providing a lower quality cleaning process. In other situations, the brush medium may be deflected into the core of the brush and release contaminants onto the substrate. That action is obviously counterproductive to a high quality substrate cleaning process.

In order to provide a consistent substrate cleaning process, several devices are known for providing a proper brush force. With one device, a drive, for example, a pneumatic cylinder, moves a brush assembly downward into contact with the substrate until the brush assembly contacts a positive stop. Thus, with the brush assembly at a known and repeatable position with each substrate, a consistent brush force is applied to each substrate. This device does not provide a particularly constant brush force and is not sensitive to changing conditions that affect brush force, such as brush wear, substrate thickness, brush medium diameter differences, stop wear, or brush core diameters. Further, such a device is difficult to accurately readjust with different size brushes and substrates.

With another device a rotating, horizontally oriented brush is mounted on a vertical slide. A counterweight is used to balance the brush assembly at a desired height such that the brush is immediately above or just touching the substrate. A cylinder is then used to move the brush assembly downward, and air pressure in the cylinder is used to provide a desired brush force onto the substrate. A device of this nature is very complex and is very difficult to maintain in a calibrated balanced condition. Further, the device is also difficult to adjust to accommodate different size substrates and different brushes. Further, this other device requires a relatively large number of components to implement and thus, is very expensive.

There are other cleaning devices in which the brush is moved through precise increments of motion and into contact with the substrate against the action of a mechanical spring. The force of the brush against the substrate is a function of the extent to which the spring is compressed. While this system is simpler than some other systems, it is also difficult to adjust for different size substrates and is also subject to inconsistencies caused by variations in the spring constant of the spring.

In another system, a substrate is supported vertically and a brush extending over a diameter of the substrate is suspended at its upper end from one end of a horizontally extending drive arm. The opposite end of the drive arm is connected to a cylinder which reciprocates the drive arm and the brush in a horizontal direction into and out of contact with the wafer. A force transducer is located at the opposite end of the drive arm and is used to control the force that the cylinder applies to the opposite end of the drive arm, thereby controlling the force that the brush applies to the substrate. This system has an advantage over prior systems in that a force used to move the brush into contact with the substrate is measured and fed back to a control, thereby providing a real time control over the force applied by the cylinder during the cleaning process. Thus, the system has the advantage of being able to provide a more consistent force during the cleaning process than the prior systems. Further, the desired or target brush cleaning force is more easily changed to accommodate different size substrates and brushes than was possible with other systems described above. However, such a system has several disadvantages. First, while the force being measured is directly related to the force being applied to the substrate, it is not a measure of the force being experienced by the substrate. The substrate is vertically suspended as are the brushes and both are subject to some deflection over their length as is the drive arm. Thus, the force on the substrate is subject to some variation over that measured at the opposite end of the drive arm. Further, the device has a further complexity in that the motion of both the substrate and the brushes must be precisely controlled.

Therefore, there is a need for an improved substrate cleaning machine that has the ability to precisely control the force being applied by a cleaning brush and also be of a reliable and cost efficient design.

SUMMARY OF INVENTION

The present invention provides a substrate cleaning apparatus having a more efficient and reliable cleaning process. The cleaning apparatus of the present invention further provides a more consistent, reliable and higher quality substrate cleaning process that has a relatively simple and inexpensive structure.

In accordance with the principles of the present invention and the described embodiments, the substrate cleaning apparatus of the present invention includes a vertically extending spindle having a substrate supported on its upper end. A brush extends generally horizontally over the substrate, and a force measuring gage is mounted to the spindle for detecting forces applied to the substrate. A spindle control is electrically connected to the force measuring gage and mechanically coupled to the spindle and causes the spindle to move as a function of the forces being applied to the substrate by the brush. The substrate cleaning apparatus of the present invention has the advantage of providing the user with a relatively simple and less expensive apparatus that provides a consistent high quality substrate cleaning process.

In another embodiment, the present invention includes a method of cleaning a substrate supported on an upper end of a spindle by first positioning a brush at a fixed elevation over the substrate. Next, the spindle is moved upward to bring the substrate into contact with the brush. Thereafter, a cleaning force on the substrate caused by the brush is measured, and the spindle is moved in response to the measured cleaning force on the substrate.

In one aspect of the invention, the substrate is first moved into contact with the brush; and thereafter, the substrate is moved upward through an incremental displacement into a cleaning contact with the brush. In another aspect of the invention, a user provides a cleaning force value and a tolerance bandwidth around that value, thereby defining a range of acceptable cleaning forces. The spindle is moved to maintain the cleaning force on the substrate within the range of acceptable cleaning forces. In a still further aspect of the invention, an acceptable cleaning force value is provided, the spindle is moved to maintain the cleaning force on the substrate substantially equal to the cleaning force value.

Various additional advantages, objects and features of the invention will become more readily apparent to those of ordinary skill in the art upon consideration of the following detailed description of the presently preferred embodiments taken in conjunction with the accompanying drawings.

DETAILED DESCRIPTION OF THE INVENTION

Figure 1:
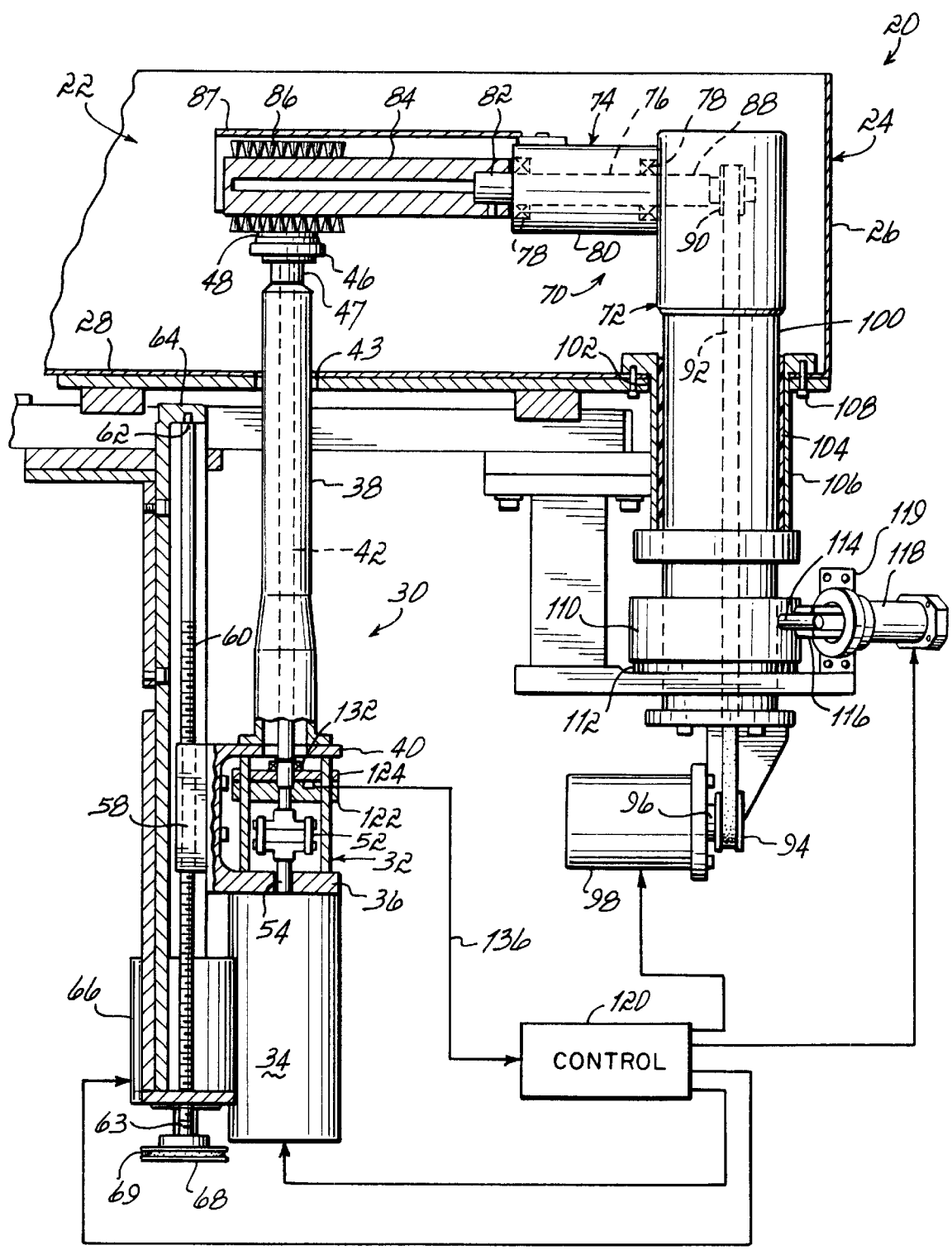
FIG. 1 is a partial cross-sectional view of wafer cleaning device including a brush force control in accordance with the principles of the present invention.

Referring to FIG. 1, a substrate cleaning system 20 includes a substrate cleaning station 22 having an enclosure 24. The enclosure 24 includes a generally cylindrical side wall 26 that is rigidly connected to an enclosure bottom 28. The enclosure 24 may be capped with a removable top or cover (not shown). Centrally located within the enclosure 24 is a spindle assembly 30. The spindle assembly 30 includes a motor mount 32 having a motor 34 rigidly connected to a bottom wall 36 and a spindle tube 38 rigidly connected to an upper wall 40. A spindle shaft 42 is rotatably mounted within the spindle tube 38, for example, by bearings 44. A chuck 46, for example, a vacuum chuck, is mounted to the upper, distal end 47 of the spindle shaft 42. The spindle assembly 30 is oriented generally vertically with respect to the enclosure 24 and extends through a center hole 43 of the enclosure bottom 28 such that the axis of rotation of the spindle shaft 42 is substantially colinear with the centerline of the cylindrical side wall 26. A substrate 48 is secured to the chuck 46 upon the chuck being activated in a known manner. The lower, proximal end 50 of the spindle shaft 42 is connected to one side of a flexible coupling 52. The opposite side of a flexible coupling 52 is connected to an output shaft 54 of the spindle rotation motor 34.

The motor mount 32 is rigidly connected, for example, by fasteners 56, to a slide 58, for example, a ball nut. The slide 58 is rotatably mounted with respect to a drive screw 60, for example, a ball screw. The ball screw is rotatably mounted at its upper end 62 to an enclosure support plate 64. The lower end 63 of the ball screw 60 is connected to a drive pulley 68 that, in turn, is connected via a toothed belt 69 to an output shaft of a spindle elevation motor 66, for example, a stepping motor, located behind the spindle shaft 60 as viewed in FIG. 1.

A brush assembly 70 is comprised of a generally vertical brush support assembly 72 having a brush arm assembly 74 extending generally radially from the upper distal end of the support assembly 72. The arm assembly 74 includes a drive shaft 76 rotatably mounted by bearings 78 within a generally cylindrical brush arm 80. The outer distal end 82 of the drive shaft 76 is connected to one end of a brush 84 having a cleaning medium 86, for example, bristles, PVA, mohair, etc., for cleaning the substrate 48. The brush 84 and medium 86 are partially enclosed by a cover or shield 87. The proximal end 88 of the drive shaft 76 is rigidly connected to a pulley 90. A drive belt 92 is mounted at one end around the pulley 90, extends through the interior of the brush support 72 and is mounted at its lower end around drive pulley 94. Drive pulley 94 is connected to an output shaft 96 of a brush rotation motor 98. Thus, energizing the brush rotation motor 98 causes the brush 84 to rotate.

The brush support assembly 72 includes a generally cylindrical hollow support tube 100 that extends through an opening 102 within the bottom 28 of the enclosure 24. The support arm 100 is rotatably mounted within a bushing 104 made of a low friction material, for example, a "TEFLON" material. The TEFLON bushing 104 is mounted within a bushing collar 106 that is rigidly secured to the bottom 28 of the enclosure 24, for example, by fasteners 108. The support arm 100 further has a drive collar 110 rigidly connected thereto, for example, by welding or being integral therewith. The drive collar 110 is mounted on a gasket 112 that is made from a low friction material, for example, a "TEFLON" material. The collar 110 further includes a drive arm 114 that is rotatably mounted to a distal end of a rod 116 extending from a brush pivot motor 118, for example, a fluid powered cylinder.

Figure 2:
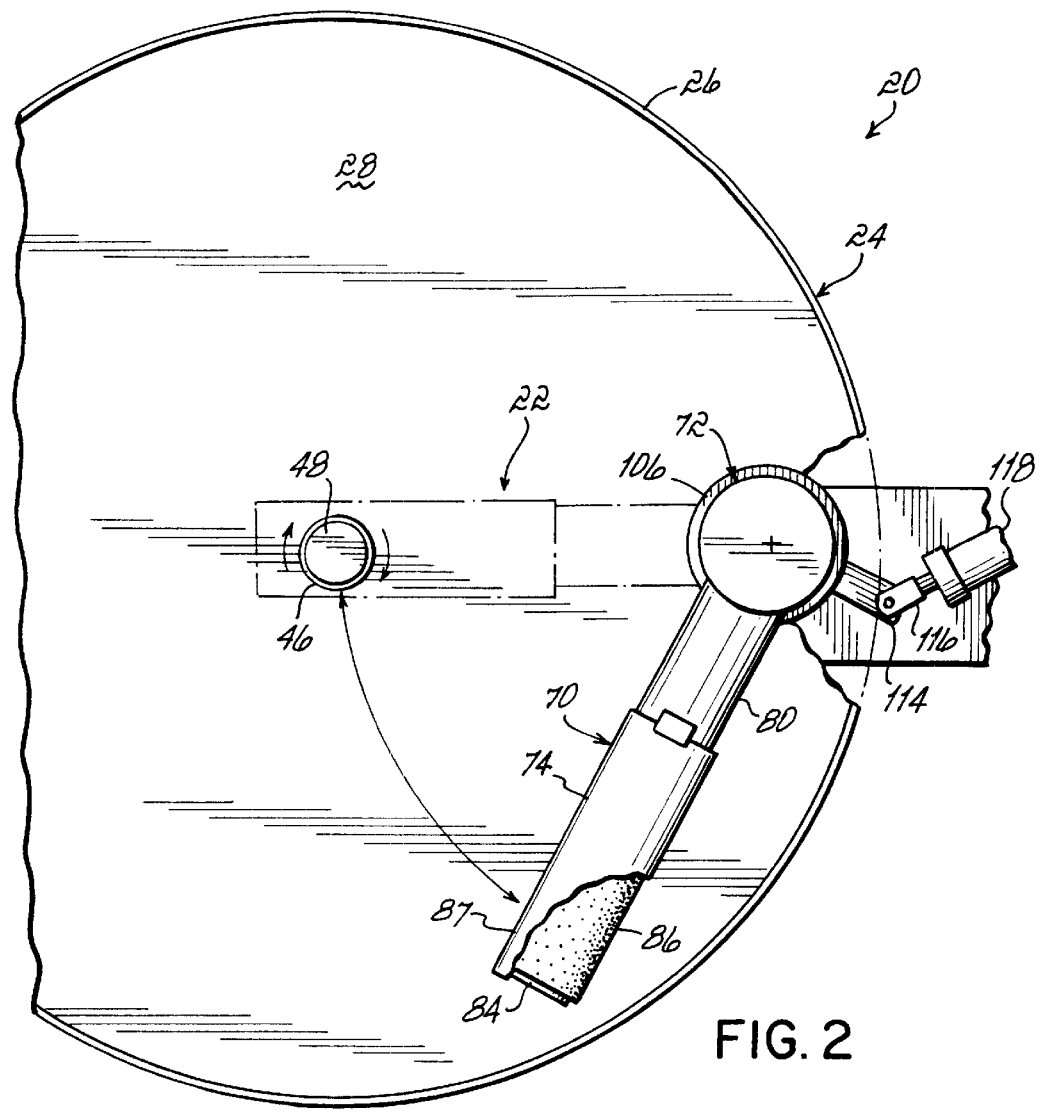
FIG. 2 is a partial top view of the wafer cleaning device of FIG. 1.

The cylinder 118 is rigidly mounted to the enclosure 24 by means of a bracket 119. Extension of the cylinder rod 116 moves the drive arm 114 and the entire brush assembly 70 through an angular displacement, for example, a clockwise angular displacement (see FIG. 2). Similarly, upon the cylinder 118 retracting the rod 116, the brush assembly 70 is angularly rotated in the opposite direction, for example, a counterclockwise direction. Therefore, for example, when the cylinder rod 116 is fully retracted, the brush assembly 70 is located in a default, rest position in which the rotating brush 84, medium 86 and cover 87 are out of contact with the substrate 48 as shown by the solid lines in FIG. 2. Thus, the brush arm assembly 74 is at a location or position that does not interfere with the loading or unloading of the substrate 48 onto or from the chuck 46. However, when the cylinder rod 116 is fully extended, the brush assembly is rotated to an operating or cleaning position in which the brush arm 84 is normally oriented generally diametrically across the wafer 48.

Figure 1A:
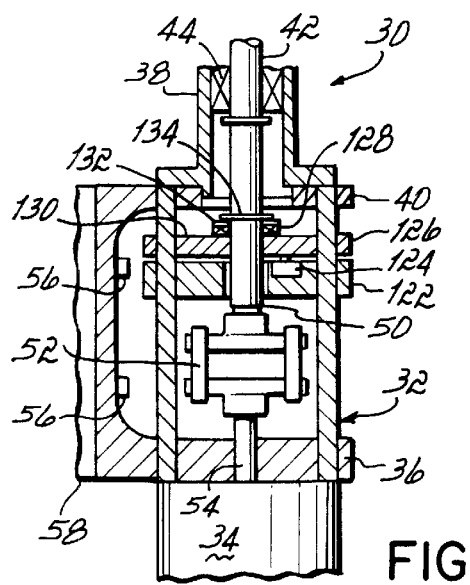
FIG. 1A is an enlarged cross-sectional view of the brush force detection mechanism in accordance with the principles of the present invention.

As previously discussed, the mechanical interface between the medium 86 of the brush 84 and the substrate 48 is very critical to achieving the highest quality cleaning process. Therefore, it is desirable that the force or pressure imposed by the medium 86 of the brush 84 onto the substrate 48 be controllable and accurately maintained during the cleaning process. To obtain the desired force control, referring to FIGS. 1 and 1A, a strain gage 122 is rigidly connected to the motor mount 32. The strain gage 122 includes a strain gage transducer 124 mechanically coupled to, for example, in contact with, a floating plate 126. The floating plate 126 is free to move or slide vertically with respect to the spindle shaft 42 and the motor mount 32. A thrust bearing 128 is in mechanical communication, for example, in contact with, an upper surface 130 of the floating plate 126. The thrust bearing has a thrust washer 132 on its upper side and a snap ring 134 is mounted within a groove (not shown) of the spindle shaft 42. Thus, any force, whether from gravity or externally applied by the rotating brush 84 onto the wafer 48, is transferred through the chuck 46 and into the spindle shaft 42. That force is then transferred from the spindle shaft 42 to the strain gage transducer 124 by the snap ring 134, the thrust washer 132, the thrust bearing 128 and the floating plate 126.

A control 120 is operatively connected to the spindle rotation motor 34, the spindle elevation motor 66, the brush rotation motor 98 and the brush pivot motor 118. The control 120 receives an input on signal line 136 from the strain gage 122 and is operative to control the operation of the spindle elevation motor 66 such that a desired force is constantly maintained on the wafer 48.

As will be appreciated, before the strain gage can be used to provide force measurements, the strain gage measuring system must be initially calibrated. In other words, the control must determine an existing preload on the spindle assembly 30, that is, forces detected by the strain gage 122 that are not caused by contact between the substrate 48 and the rotating brush 84. In this process, the output signal from the strain gage 122 is sampled by the control 120, and the control 120 then produces a force reading or value representing the spindle preload force. A force reading or value from samples of the output signal of the strain gage 122 is determined by using known processes, for example, a force reading may consist of an average of sixty samples of the output signal of the strain gage 122 taken over 1 second. The calibration process permits the control 120 to discriminate the forces applied by the rotating brush 84 from pre-existing forces on the spindle assembly 30. Often the calibration process is done as part of a machine setup procedure but alternatively, may be done at some other point in the cycle of operation.

In use, as part of the substrate or semiconductor wafer processing, a wafer 48 is loaded by known robotic means onto the chuck 46. During that loading process, referring to FIG. 2, the cylinder rod 116 is retracted within the cylinder 118 and the brush assembly 70 is located at its default or rest position. The rest position is a position within the enclosure 26 where the brush does not interfere with the loading, unloading of the wafer 48. Further, at this time, the control 120 has provided a command signal to turn on the brush rotation motor 98, thereby causing the brush 84 to rotate at a desired angular velocity.

Figure 3:
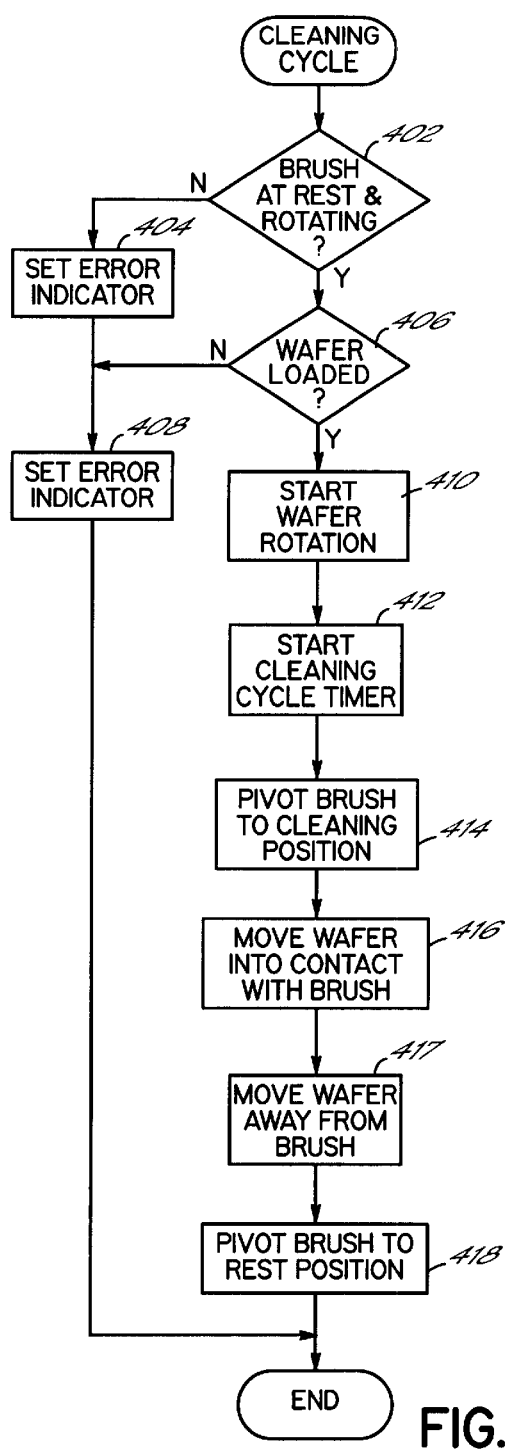
FIG. 3 is a flow chart illustrating the steps of a cleaning cycle executed by the cleaning device of FIG. 1.

Thereafter, a substrate cleaning cycle is executed having the process steps generally illustrated in the flow chart of FIG. 3. First, the control 120 determines at 402, that the brush assembly 70 is at its rest position and that the brush 84 is rotating. If either of those conditions is not met, the control 120 activates at 404, an error indicator, for example, an LED or screen display, identifying which of the conditions is not met. If the brush is at the rest position and rotating, the control 120 then determines at 406, whether the wafer 48 is loaded onto the chuck 46. If, for example, the chuck is a vacuum chuck, the control 120 checks whether the vacuum solenoid feeding the chuck 46 has been activated. Alternatively, although not shown, the control 120 can, in a known manner, monitor a pressure transducer in a pressure measuring relationship with the chuck 46 to determine that the wafer is loaded. If the control 120 determines that the wafer is not properly loaded onto the chuck 46, it sets at 408, an error indicator representing the detected error condition.

If the wafer 48 is properly loaded, the control 120 then at 410 provides a command signal to turn on the spindle rotation motor 34, thereby causing the wafer 48 to rotate at a desired angular velocity. Next, at 412, the control starts an internal cleaning cycle timer. Thereafter, the control 120 at 414, provides a command signal to activate the brush pivot motor 118. In the illustrated example, control 120 causes fluid to be ported into the cylinder 118, extending the cylinder rod 116 therefrom, thereby pivoting the arm 114 and brush assembly 70 to the brush cleaning position illustrated in phantom in FIG. 2. Normally, in the cleaning position, the brush 84 is located diametrically across the substrate 48. Further, cleaning fluids are dispensed either through the brush or externally onto the substrate 48 in a known manner.

Next, at 416, the control 120 executes a subroutine to move the wafer 48 in a vertically upward direction into contact with the rotating brush 84. There are many different processes that may be implemented in moving the wafer into contact with the brush, and several of those processes will be described. As part of each of the processes, a check is made for the expiration of the cleaning cycle timer. Upon detecting the expiration of the cleaning cycle timer, the control 120, at 417, provides a command signal to the motor 66 to lower the spindle 38 and motor mount 32, thereby moving the substrate 48 away from and out of contact with the brush 84. Normally, the spindle assembly 30 and substrate 48 will be lowered to the vertical positions at which they started the cycle at step 416. Next the control 120, at 418, provides a command signal that operates the brush pivot cylinder 118 to retract the cylinder rod 116, thereby pivoting the brush assembly 70 back to its default, rest position illustrated in FIG. 2.

Figure 4:
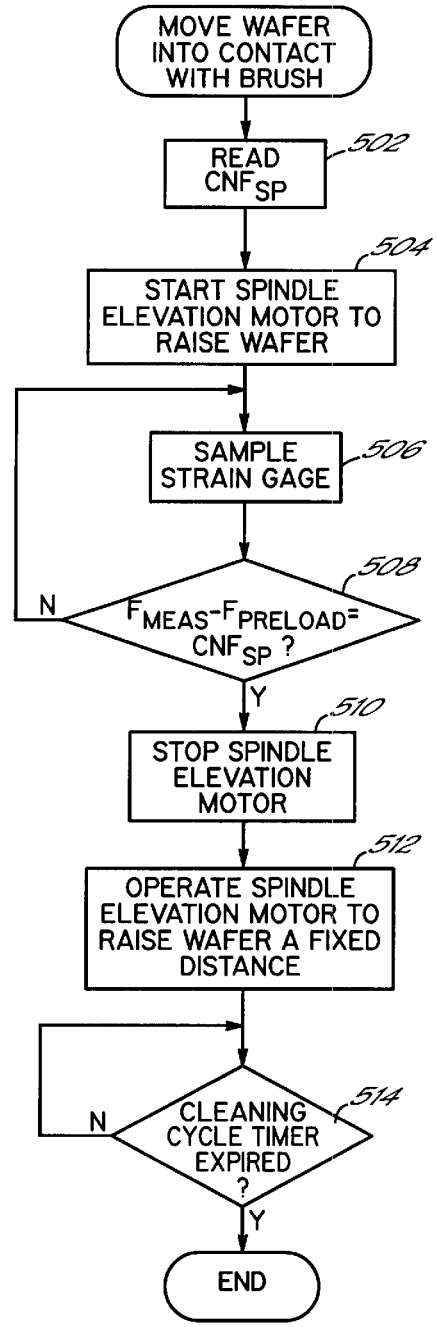
FIG. 4 is a flow chart illustrating one embodiment of the step of moving the substrate into contact with the brush within the cleaning process of FIG. 3.

A first method for moving the wafer into contact with the brush is a two-step process in which the wafer is first moved to a desired elevation at which it initially contacts the rotating brush 84. Thereafter, the wafer 48 is moved a fixed increment in the vertically upward direction into the brush. That two-step process is implemented using the process of FIG. 4. At 502, the control 120 first reads a previously stored contact force setpoint value. The contact force setpoint is the minimum value of force between the wafer and the brush that is detectable by the strain gage 122. That contact force value can be determined by any number of methods and is normally determined in a preprocessing calibration cycle. Once that contact force value is determined, it is stored within the control 120 and is read at 502 as a contact force setpoint or reference value $CNF_{sp}$.

The control 120 at 504, provides a command signal to start the spindle elevation motor 66 rotating in a direction that causes the ball nut 58, motor mount 32 and spindle assembly 30 to move upward toward the rotating brush 84. Simultaneously, the control at 506 is monitoring or sampling the output signal from the strain gage 122 and at 508, determines whether the force being applied by the rotating brush against the spindle 48 is equal to the force reference or setpoint value. In the illustrated method, the force being applied by the rotating brush 84 is equal to the gross force measured by the control 120 less the previously determined preload force. That difference is then compared to the contact force setpoint. Upon detecting an equality, the control 120 then provides a command signal at 510, to turn the spindle elevation motor 66 off.

After achieving the brush contact position, the control 120 at 512, operates the spindle elevation motor 66 to raise the wafer a predetermined fixed distance. In some applications, once the contact position is accurately determined, the brush force may be adequately controlled by simply incrementing the wafer into the brush over a fixed distance. The applicability of this method to a particular cleaning process will depend on the application variables. The brush stays in contact with the wafer until the cleaning cycle timer expires as detected by the controller 120 at 514. Thereafter, the controller causes the spindle assembly 30 and substrate 48 to be lowered out of contact with the brush, at 417 of FIG. 3; and thereafter, the brush 84 is pivoted back to its original position, at 418 of FIG. 3.

Figure 5:
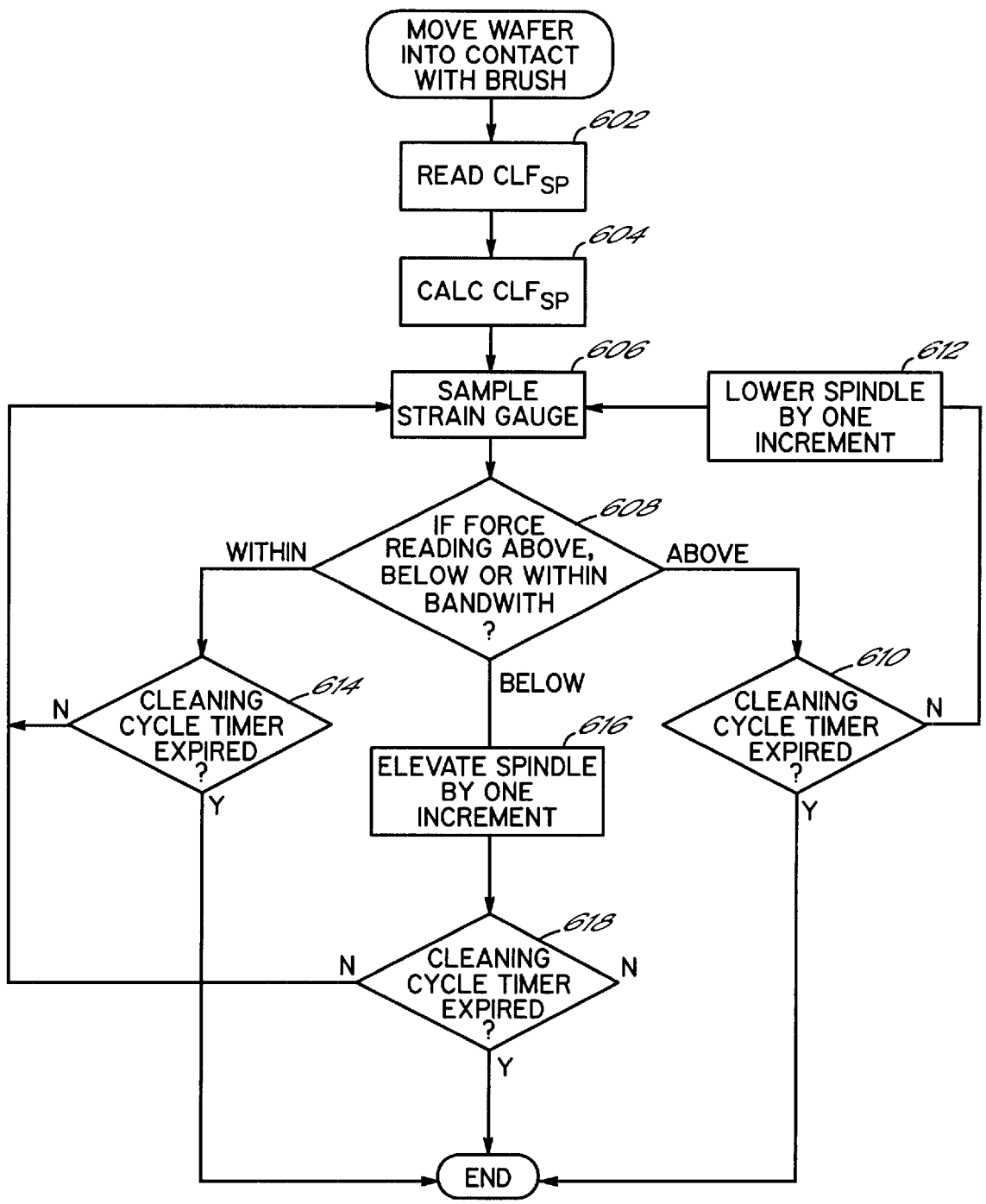
FIG. 5 is a flow chart illustrating another embodiment of the step of moving the substrate into contact with the brush within the cleaning process of FIG. 3.

Referring to FIG. 5, a second method for moving the wafer into contact with the brush is to maintain the force between the wafer 48 and the rotating brush 84 within a force range. The controller 120 at 602 reads a cleaning force setpoint from memory. The cleaning force setpoint may be determined by any one of several methods including a preprocessing experimental cleaning cycle in which wafers are cleaned at different forces. By observing and testing the cleaned wafers, a desired cleaning force is thus determined and input to the control 120 as a cleaning force setpoint $CLF_{sp}$ utilizing known input devices. Next, at 604, the controller calculates a force range in accordance with a tolerance that is entered into the control 120 by the user. If the tolerance is, for example, 10%, the cleaning force bandwidth or range, $CLF_{BW}$, would have a lower limit of $0.9 \times CLF_{sp}$ and an upper limit of $1.1 \times CLF_{sp}$.

After determining the range of acceptable forces between the substrate 48 and the rotating brush 84, the control 120, at 606, proceeds to sample force measurements of the strain gage in a manner as previously described. Thereafter, the control, at 608, determines whether the measured force is above, within or below the acceptable force range or bandwidth. If the force reading is above the acceptable range, the control 120, at 610, then checks whether the cleaning cycle timer has expired. If it has not, the control 120, at 612, then provides a command signal to start the spindle elevation motor 66 rotating in a direction that causes the ball nut 58, motor mount 32 and spindle assembly 30 to move downward away from the rotating brush 84. The downward motion is a fixed incremental displacement determined by the control 120 counting a fixed number of pulses to the stepping motor 66.

The control 120 then, at 606, again samples a strain gage and, at 608, determines whether the force measurement is above, within or below the bandwidth. If the force reading is within the cleaning force bandwidth, the control 120, at 614, checks the state of the cleaning cycle timer; and if it has not expired, again samples the strain gage at 606. If at 608, the control 120 determines the force measurement is below the cleaning force range, at 616, the control 120 provides command signal to start the spindle elevation motor 66 rotating in a direction that causes the ball nut 58, motor mount 32 and spindle assembly to move upward toward the rotating brush 84. The upward motion is again a fixed incremental motion that is normally determined by the control 120 counting a number of pulses to the stepping-motor 66. Thereafter, at 618, the control again checks the state of the cleaning cycle timer and the above process continues for the duration of the cleaning cycle. The above process is effective to maintain a cleaning force within a predetermined tolerance of the cleaning force setpoint as determined by the user. Upon the cleaning cycle timer expiring, the control 120 causes the spindle assembly 30 and substrate 48 to be lowered as provided at 417 of FIG. 3; and thereafter, the control 120 causes the brush to pivot back to its rest position as provided at 418 of FIG. 3.

Figure 6:
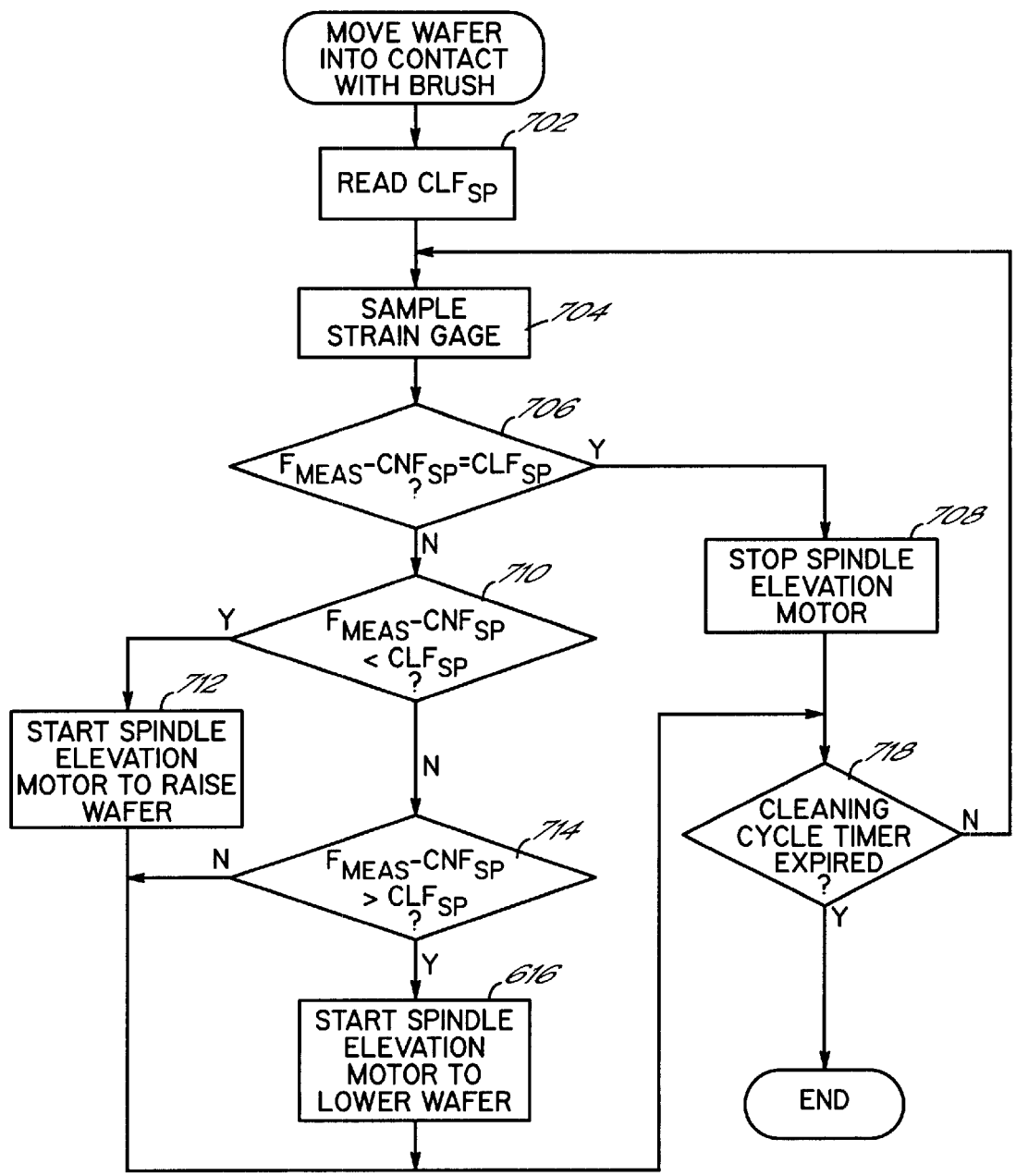
FIG. 6 is a flow chart illustrating a further embodiment of the step of moving the substrate into contact with the brush within the cleaning process of FIG. 3.

Referring to FIG. 6, a third method for moving the wafer into contact with the brush is to maintain the force between the wafer 48 and the rotating brush 84 at a cleaning force setpoint value. The control 120, at 702 reads a cleaning force setpoint from memory. Thereafter, the control at 704, samples the strain gage 122 and at 706, determines whether the forces being applied by the rotating brush 84 onto the substrate 48 are equal to the cleaning force setpoint. The cleaning forces exerted by the rotating brush 84 may be determined by subtracting the contact force setpoint from the gross force measured by the strain gage 122.

If the brush force is equal to the cleaning force setpoint, the control 120 at 708, stops the operation of the spindle elevation motor 66. If the force being applied by the rotating brush 84 does not equal the cleaning force setpoint, the control at 710, detects whether the brush force is less than the cleaning force setpoint. If so, at 712, the control 120 provides command signals to the spindle elevation motor 66 to move the wafer 48 closer to the rotating brush 84. In the current example, the spindle elevation motor 66 is operated to raise the spindle assembly 30 and wafer 48. If the control 120 detects that the applied force of the rotating brush 84 is greater than the cleaning force setpoint value, the spindle elevation motor is operated by the control 120 at 716, to move the wafer away from the rotating brush. In the current example, the spindle elevation motor 66 is operated to move the spindle assembly 30 and wafer 48 downward.

After operating the spindle elevation motor 66 as described above, the control 120 at 718, then checks whether the cleaning cycle timer has expired. If not, the subroutine of FIG. 6 causes the control 120 to iterate the process of FIG. 6 beginning with the sampling of the force signal at 704. By repeating the process of FIG. 6, the control 120 causes the elevation of the spindle assembly 30 and wafer 48 to be continuously adjusted, so that the cleaning force applied by the rotating brush 84 remains substantially constant and equal to the cleaning force setpoint. When the control 120 determines at 718, that the cleaning cycle timer has expired, the subroutine of FIG. 6 ends. Thereafter, referring to FIG. 3, the control 120 first, at 417, provides a command signal that operates the motor 66 to lower the spindle assembly 30 and substrate; and thereafter, the control 120, at 418, provides a command causing the brush pivot cylinder 118 to retract the cylinder rod 116, thereby pivoting the brush assembly 70 back to its default, rest position illustrated in FIG. 2.

Thus, the substrate cleaning apparatus of the present invention has the advantage of providing the user with a relatively simple and less expensive apparatus that provides a consistent high quality substrate cleaning process.

While the present invention has been illustrated by a description of various preferred embodiments and while these embodiments have been described in considerable detail in order to describe the best mode of practicing the invention, it is not the intention of Applicants to restrict or in any way limit the scope of the appended claims to such detail. Additional advantages and modifications within the spirit and scope of the invention will readily appear to those skilled in the art. For example, while the spindle elevation motor 66 is described as a stepping motor, as will be appreciated, other motors or drive systems may be used to move the spindle assembly and substrate. Further, while the described embodiment utilizes a strain gage to detect the brush cleaning forces, other devices and methods of accurately detecting brush cleaning forces may also be used.

Therefore, the invention in its broadest aspects is not limited to the specific detail shown and described. Consequently, departures may be made from the details described herein without departing from the spirit and scope of the claims which follow.

What is claimed is:

1. A method of cleaning a substrate supported on an upper end of a spindle comprising:
   positioning a brush at a fixed elevation over the substrate;
   moving the spindle in an upward direction to bring the substrate into contact with the brush;
   measuring a cleaning force on the spindle caused by the brush contacting the substrate; and
   moving the spindle in response to measuring the cleaning force on the substrate caused by the brush.

2. A method of claim 1 further comprising:
   moving the substrate in the upward direction toward the brush;
   stopping motion of the spindle in response to detecting an initial contact force exerted on the substrate by the brush; and
   thereafter moving the spindle an incremental displacement in the upward direction to bring the substrate into cleaning contact with the brush.

3. A method of claim 1 further comprising:
   determining a range of acceptable cleaning forces between the cleaning brush and the substrate;
   maintaining the cleaning force on the substrate within the range of acceptable cleaning forces.

4. A method of claim 3 further comprising:
   providing user determined cleaning force and tolerance values; and
   determining the range of acceptable cleaning forces in response to the user determined cleaning force and tolerance values.

5. A method of claim 4 further comprising:
   determining preload forces on the spindle in the absence of the brush contacting the substrate; and
   determining the range of acceptable cleaning forces in response to the preload forces.

6. A method of claim 3 further comprising moving the spindle and substrate selectively upward and downward to maintain the cleaning force within the range of acceptable cleaning forces.

7. A method of claim 6 further comprising:
   detecting a cleaning force in excess of the range of acceptable cleaning forces; and
   reducing the measured clean force.

8. A method of claim 7 further comprising moving the spindle in a downward direction to reduce the measured cleaning force.

9. A method of claim 6 further comprising:
   detecting a cleaning force less than the range of acceptable cleaning forces; and
   increasing the measured cleaning force.

10. A method of claim 9 further comprising moving the spindle in an upward direction to increase the measured cleaning force.

11. A method of claim 1 further comprising:
    determining an acceptable cleaning force between the cleaning brush and the substrate;
    maintaining the cleaning force on the substrate substantially equal to the acceptable cleaning force value.

12. A method of claim 11 further comprising:
    providing user determined cleaning force and tolerance values; and
    determining the acceptable clearing force in response to the user determined cleaning force and tolerance values.

13. A method of claim 12 further comprising:
    determining preload forces on the spindle in the absence of the brush contacting the substrate; and
    determining the acceptable cleaning force in response to the preload forces.

14. A method of claim 11 further comprising moving the spindle and substrate selectively upward and downward to maintain the cleaning force substantially equal to the acceptable cleaning force value.

15. A method of claim 14 further comprising:
    detecting a cleaning force in excess of the acceptable cleaning force value; and
    reducing the cleaning force between the substrate and the brush.

16. A method of claim 15 further comprising moving the spindle in a downward direction to reduce the measured cleaning force value.

17. A method of claim 14 further comprising:
    detecting a cleaning force less than the acceptable cleaning force value; and
    increasing the cleaning force between the substrate and the brush.

18. A method of claim 17 further comprising moving the spindle in an upward direction to increase the measured cleaning force value.

* * * * *